United States Patent
Feiler

(10) Patent No.: US 6,236,068 B1
(45) Date of Patent: May 22, 2001

(54) TRANSISTOR COMPONENT

(75) Inventor: Wolfgang Feiler, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/094,780

(22) Filed: Jun. 15, 1998

(30) Foreign Application Priority Data

Jun. 13, 1997 (DE) .............................. 197 25 091

(51) Int. Cl.⁷ .............................. H01L 29/78; H01L 33/00
(52) U.S. Cl. .......................................... 257/133; 257/139
(58) Field of Search ................................ 257/133, 139, 257/141

(56) References Cited

U.S. PATENT DOCUMENTS 4,963,951 * 10/1990 Adler et al. .
5,920,087 * 7/1999 Nakagawa et al. .

OTHER PUBLICATIONS

Appels, J.A. et al, "High Voltage Thin Layer Devices (Resurf Devices)", IEDM Techn. Dig., pp. 238–241, 1979.
Pattanayak, D.N. et al., IEEE Trans. ED–33, pp. 1956–1963, 1986.

* cited by examiner

*Primary Examiner*—Stephen D. Meier
(74) *Attorney, Agent, or Firm*—Kenyon & Kenyon

(57) ABSTRACT

A transistor component and a method of producing the transistor component having at least one insulated-gate electrode and with lateral and vertical current flow. The transistor component is used for low-loss switching of high currents and is optionally designed in bipolar or MOS technology. The component includes a rear contact connected to a substrate across a highly doped region, where the highly doped region has a concentration profile of the dopant atoms that tapers out smoothly into the interior of the component. The highly doped region can be produced by a diffusion process.

18 Claims, 8 Drawing Sheets

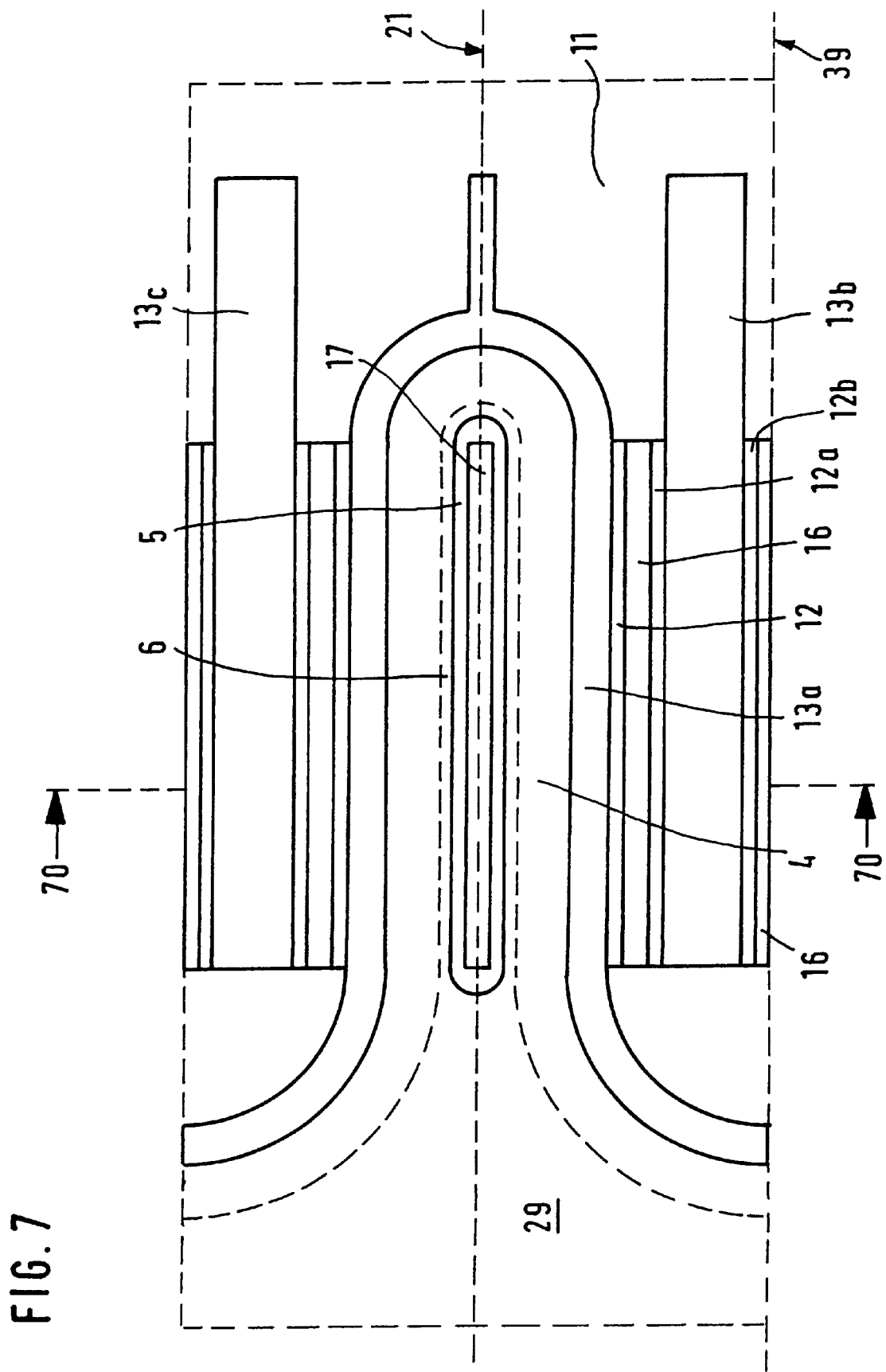

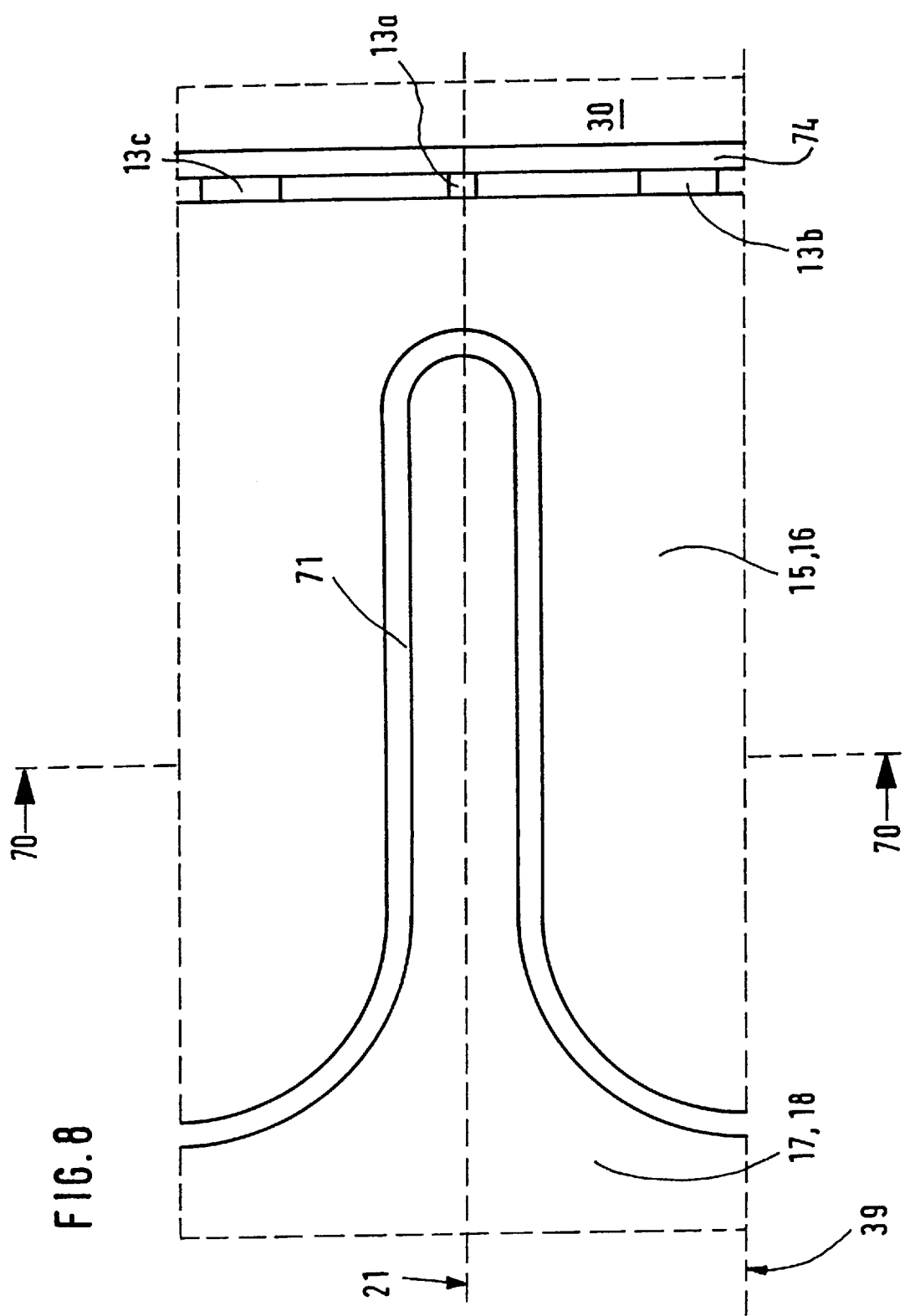

TRANSISTOR COMPONENT

FIELD OF THE INVENTION

The present invention relates to a transistor component and a method of manufacturing the same, specifically a transistor component with a high current carrying capacity and good transmission properties.

BACKGROUND INFORMATION

A transistor component designed as a lateral bipolar transistor with an insulated gate having lateral and vertical current flow is described in D. N. Pattanayak et al., IEEE Trans. ED-33, pp. 1956–1963, 1986. The described transistor component is designed as an N-channel LIGBT (lateral isolated-gate bipolar transistor) on epitaxial silicon which is grown on a P substrate with high or low doping. The rear of the component can be connected by a rear contact. To achieve a high blocking ability in LIGBT, the resurf (reduced surface field) principle (see High Voltage Thin Layer Devices (Resurf Devices), J. A. Appels et al., IEDM Technical Digest, pp. 238–241, 1979) is usually adopted, again using an epitaxial layer.

SUMMARY OF THE INVENTION

The present invention provides a transistor component with a high-current carrying capability and low forward voltage drop in the "on" state plus the advantage of easy manufacture. The voltage drop amounts to only a few volts in the static "on" state at a current density on the order of 100 A/cm$^2$. A good rear connection is achieved due to the fact that the rear contact is connected across a P−/P+ junction formed by diffusion in a P− substrate. For a given blocking ability of the device, many carriers are made available for good transmission properties in the "on" state, with the carriers present in a P− substrate region with rear diffusion having a longer lifetime in comparison with charge carriers moving in an epitaxial P− region on a P+ substrate. This yields a further increase in current carrying capability. The increased current carrying capability achieved by increasing the vertical current in the device would also be possible by means of a reduced thickness of the P− epitaxial layer with an epitaxial P−/P+ junction. However, this would lead to reduced blocking ability of the device in static turn-off and, especially in dynamic turn-off. In the case of rear diffusion, the diffusion profile runs down into the depth of the wafer far less abruptly than is the case with an epitaxial layer. Therefore, a high-current carrying capability is possible together with a guaranteed blocking ability at the same time in both static and dynamic turn-off.

According to the present invention, a multichannel principle contributes to a small effective total channel resistance with both LIGBT and MOS transistors due to parallel connected channel regions and thus contributes to an increase in current carrying capability and good transmission properties. Also, an increased robustness against latch-up is guaranteed simultaneously with the increased current carrying capability as a result of the rear diffusion. Due to the region which is designed as a diffusion region over which the device is connected to the rear contact, the required horizontal current device of the component is reduced, so that triggering of the lateral parasitic thyristor is suppressed. At the same time, the component as a whole has improved current carrying capability.

According to the present invention, reduction in the required horizontal current component and thus increased robustness against latch-up results in an optional reduction of the total area of the device.

In a LIGBT, the multichannel principle has also a positive effect on latch-up strength. Due to a plurality of parallel connected channel regions, a smaller current flows per parasitic thyristor, which also reduces the risk of triggering the parasitic thyristor. Rear contacting over a region designed as a diffusion region also ensures a high pulse strength, i.e., the device can handle the simultaneous occurrence of high voltage and high-current density. In contrast to the manipulative of the P−/P+ junction by means of epitaxy, the design as a diffusion region results in smaller doping gradients. This ensures a high pulse strength, especially in a dynamic turn-off. As a result of the smaller doping gradient, the vertical current flow in the device and also the blocking ability react less sensitively to variations in thickness of the substrate. This permits a more simple design of the component.

According to the present invention, designing an n region arranged on the front of the device as a resurf region leads to a higher breakdown voltage, i.e., a large blocking capabilities of the device, as a result of a favorable field-strength distribution in the space-charge region due to the thinness of the resurf layer in combination with its dopant concentration. If the breakdown voltage is not to be increased, a smaller lateral extent may optionally be selected, to ensure a higher current carrying capability per crimp area and larger latch-up suppression in, for example, a multichannel arrangement, or simply in a parallel connection of several components on the same given chip area. If the possibility of ensuring a higher breakdowns voltage is selected instead of a smaller lateral extent, then a breakdown voltage of several hundred volts can be achieved in the static turn-off state by using the resurf region, i.e.; when no voltage is applied to the gate electrode. If the resurf region is produced by a diffusion process instead of epitaxial deposition, this yields by analogy with rear diffusion a longer lifetime of the charge carriers, which in turn has a positive effect on the forward voltage drop in the "on state".

The transistor component according to the present invention is provided with a buffer layer around the anode region to avoid the punch-through effect. If the anode region has a high dopant concentration and thickness and consequently the buffer layer has a larger junction depth than the n region, this permits a good rear connection, i.e., on properties, while still reliably preventing any punch-through effect.

Providing highly doped dopant zones by means of which the cathode and source terminals are connected to the semiconductor substrate leads to a low contact resistance at the terminals.

BRIEF DESCRIPTION OF THE DRAWINGS

FIG. 7 shows a second detail view of the top view of the exemplary transistor component of FIG. 2.

FIG. 8 shows a third detail view of the top view of the exemplary transistor component of FIG. 2.

DETAILED DESCRIPTION

Figure 1:
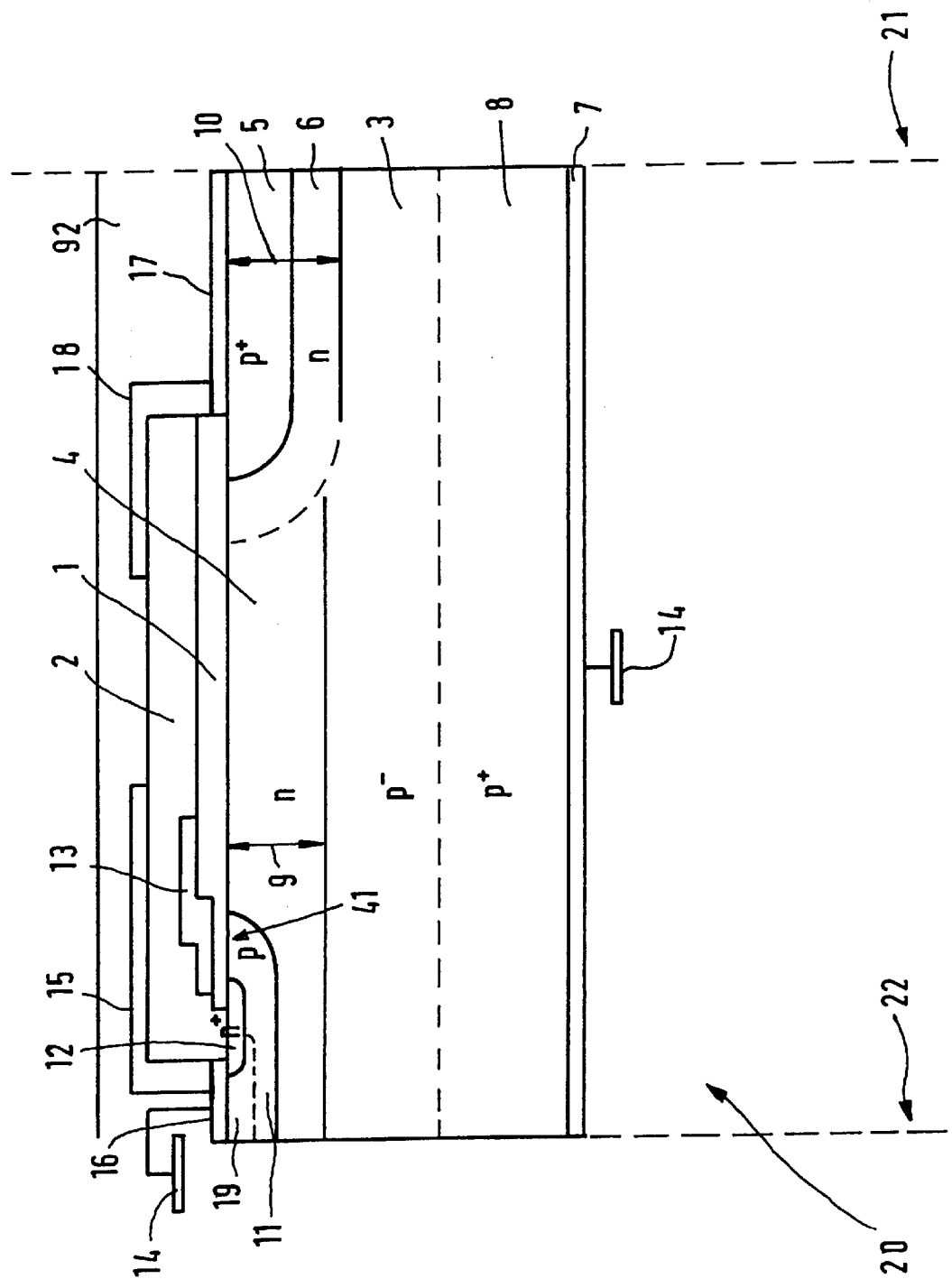
FIG. 1 shows a cross section of a first exemplary embodiment of a transistor component according to the present invention.

FIG. 1 shows a cross section of an exemplary transistor component designed as a LIGBT with a rear contact 7. An n region 4 with a p well 11 embedded in it has been introduced into the front side of p substrate 3. An n well 12 which is in turn embedded in p well 11 is connected to ground 14 via cathode terminal 16. Likewise, p well 11 is connected to cathode terminal 16 by a heavily p-doped dopant zone 19. A heavily p-doped anode region 5 which is introduced into n region 4 is spatially separated from p well 11 by a portion of n region 4. This anode region 5 is shielded from N region 4 by a buffer layer 6 which is more highly N-doped than n region 4. This shielding is also present with respect to the underlying p substrate 3. Anode region 5 can be contacted electrically through anode terminal 17. Cathode terminal 16 and anode terminal 17 are provided with a cathode field plate 15 and an anode field plate 18 for field shielding. A region of p well 11 between n well 12 and n region 4, which is provided so that it can be switched as an inversion channel region 41, can be driven by a gate electrode 13 which is insulated from the semiconductor substrate by insulation layer 1. Anode and cathode field plate 15, 18 are insulated from the gate electrode by another insulation layer 2. Another insulation layer 92, e.g., made of silicon nitride, forms a passivation layer covering the entire component with openings only through bond pads by means of which the component can be driven. In the embodiment shown in FIG. 1, the penetration depth 10 of the buffer layer 6 has been selected to be larger than the depth of penetration 9 of the n region 4. Like cathode terminal 16, the rear contact 7 arranged on the side of semiconductor substrate designated as the rear side is connected to ground 14. The electric contact with semiconductor substrate 3 is established through a strongly p-doped region 8 which is designed as a diffusion region. The lines identified with reference numbers 21 and 22 in FIG. 1 denote first and second lines of symmetry with regard to which the detail 20 shown here can be continued as a mirror image repeatedly. The entire outside edge of the device is connected to ground and contains only a deep p+ diffusion region which extends into the p− substrate (not shown in the drawing) to shield the component toward the outside.

If a positive potential is applied to gate electrode 13 in the LIGBT shown here, electrons in part of p well 11 are drawn to the surface below insulation layer 1, thus forming an inversion channel 41. When there is a positive potential at anode contact 17 with respect to the reference potential (ground), electrons flow from n well 12 through the inversion channel and the n region to anode region 5, from which holes are injected into N region 4. They, n region 4 because a conductivity modulated. In addition to the lateral current flow described here, a vertical current flow begins between anode region 5 and rear contact 7 as a result of the holes injected from anode region 5, especially in a dynamic turn-off, i.e., when an inductive load is applied between the cathode and anode this current is carried almost exclusively by holes. In the steady "on" state of the transistor component, approximately one third of the total current flows over rear contact 7. In a turn-off, especially with an inductive load, approximately 80% of the current flows over the layer sequence tangent to anode region 5, n-doped buffer layer 6 and P substrate 3 with the adjacent strongly P-doped region 8 acting as a PNP transistor. In addition to the above-mentioned lateral current path, the vertical current path described last should have the highest possible current carrying capability, i.e., good transmission properties. A good current carrying capability of the vertical current path makes it possible to reduce the lateral current, otherwise a latch-up could occur at a high current. This latch-up can be explained by unwanted triggering of a parasitic thyristor formed by the lateral succession of regions 12, 11, 4 or 6 and 5. The n well trough 12 and p well 11 are short-circuited over cathode terminal 16. However, if injected holes flow from anode region 5 beneath one well 12 through p well 11 and reach cathode terminal 16, there is a lateral voltage drop leading to triggering of the lateral diode formed from n well 12 and p well 11, so that the above-mentioned parasitic thyristor is triggered and the current flow can no longer be easily controlled by the gate electrode.

In contrast to the related art, the highly p-doped region 8 is now designed as a diffusion region in the weakly doped p substrate 3 and not as a high-doped P substrate on which a weakly doped p-doped layer is produced epitaxially. This leads to a diffusion profile, i.e., a concentration distribution of the p doping atoms which runs out far less abruptly from the rear into the depth of the wafer than substrate diffusion into an epitaxial layer. Due to the smaller concentration gradient at the p−/p+ junction, the local field strengths are lower, which prevents a dynamic avalanche and thus leads to a large pulse strength in the case of a high vertical current carried mainly by holes in a dynamic turn-off. However, high doping alone, which could also be achieved by an epitaxial process, does not lead to the desired goal, because a large concentration gradient leads to a high power loss. However, the vertical PNP transistor present in the LIGBT structure is electrically well connected to the rear due to p+ rear diffusion and carries approximately one third of the total current with no problem in a static turn-on case, and even carries 80% in a dynamic turn-off. Use of rear diffusion in comparison with epitaxy on a highly doped substrate results in the pulse strength of the LIGBT being greater because the diffusion profile runs out less abruptly into the depth of the wafer, and a dynamic avalanche breakdown can be suppressed better in a turnoff, especially at high voltage and high current. Furthermore, the reaction of the transmission properties to variations in thickness of the p substrate is less sensitive, i.e., there is less reaction in the voltage drop between the anode and the rear contact 7 in the "on" state at a given current density because of the smooth run-out of the rear diffusion. Moreover, the lifetime of the carriers is longer in comparison with an epitaxial zone in a substrate region of the same dopant concentration. This is generally so high that the transmission properties are not dominated by the lifetime of the carriers. For this reason, the resurf region which is described below should not be produced by an epitaxial method but instead by a diffusion process.

In this embodiment, the n region 4 is designed as a resurf region. The condition for such a layer is explained in the article cited initially regarding resurf applications. The integral of the dopant concentration over the layer thickness must be approximately $10^{12}$ cm$^{-2}$. This choice of parameters ensures that higher voltages can be applied between cathode terminal 16 and anode terminal 17 (with gate electrodes that are not positively triggered) without resulting in an unwanted breakdown. The field strength close to the surface of the device at a pn junction between P trough 11 and n region 4 is especially critical if the dose of dopant in the resurf zone is too high because, close to the surface, the PN junction has a curvature at which the electric field of the space-charge zone is excessive due to the geometry. If, on the other hand, the dopant concentration in the resurf region is too low, there is a critical field magnification at n-doped buffer layer 6.

If a positive voltage is applied at the anode terminal, the junction between the p well 11 and the n region 4 is in the blocking state. The same thing applies to the junction between substrate 3 and n region 4. Then with a non-positively triggered gate electrode and an applied positive voltage on anode terminal 17, a certain field strength prevails at the junction between p well 11 and anode region 5 due to a depletion of carriers around this junction. This field strength is then influenced by the directly adjacent interface between n region 4 and substrate 3. This adjacent horizontal pn junction which is also in its blocking state in conjunction with the lateral pn junction between p trough 11 and resurf region 4 causes an increase in the space-charge zone which not only runs close to the pn junction between n region 4 and P well 11 at a given anode voltage but also fills the entire n region 4 very rapidly with an increase in anode voltage. This yields a more uniform field-strength distribution between the cathode and anode terminals in n region 4, which means that a lower field strength prevails at the pn junction between p well 11 and n region 4 itself in comparison with the case when n region 4 is not designed as a resurf region, i.e., in the case where the horizontal pn junction between n region 4 and substrate 3 lies deep in the substrate and has a dopant concentration differing from the optimum dose. This explains the fact that higher voltages can be applied at anode terminal 17 with the transistor component illustrated in FIG. 1 with n region 4 designed as a thin resurf layer until an unwanted breakdown occurs at the PN junction between P trough 11 and n region 4. Thus, if a certain blocking capability is already sufficient, the distance between the first line of symmetry 21 and the second line of symmetry 22 may optionally be reduced to permit a reduction in size of the component as an alternative to increasing the blocking capability.

In the absence of buffer layer 6, use of the resurf principle would lead to a reduction of the diffusion barrier between the p anode region 5 and resurf region 4 due to a punch-through because of the complete carrier depletion of resurf zone 4. To prevent this, a buffer layer 6 is provided between anode region 5 and n region 4 in the embodiment, shielding anode region 5 from n region 4 due to the fact that buffer layer 6 is more highly n doped than n region 4. This prevents punch-through of the space-charge zone from the resurf region to the anode, so that a punch-through breakdown can be prevented. The dopant concentration of buffer layer 6 is higher than that of n region 4, but the concentration selected must not be too high so that in the "on" state the hole injection which takes place from anode region 5 into the n region 4 and p substrate 3 is not hindered too greatly, which would result in a larger forward voltage drop of the device. For a good low forward voltage drop of the device, anode region 5 should project as far as possible into the device in the vertical direction and should have a high p dopant dose. This explains the fact that in the embodiment in FIG. 1, the penetration depth 10 of the buffer layer is greater than the penetration depth 9 of the n region 4. On the other hand, anode region 5 must not be too deep because otherwise the blocking ability of the device in the vertical direction would be lost.

Insulation layers I can be produced by the known LOCOS technology (local oxidation of silicon) which makes it possible to produce oxide layers of variable thickness with the help of nitride passivation. The magnetoresistors described here are used to reduce field peaks, for example, in proximity to gate electrode 13 or at buffer 6. However, the magnetoresistors are optional, may be designed in one or more steps and may be made of metal and/or polysilicon.

Figure 2:
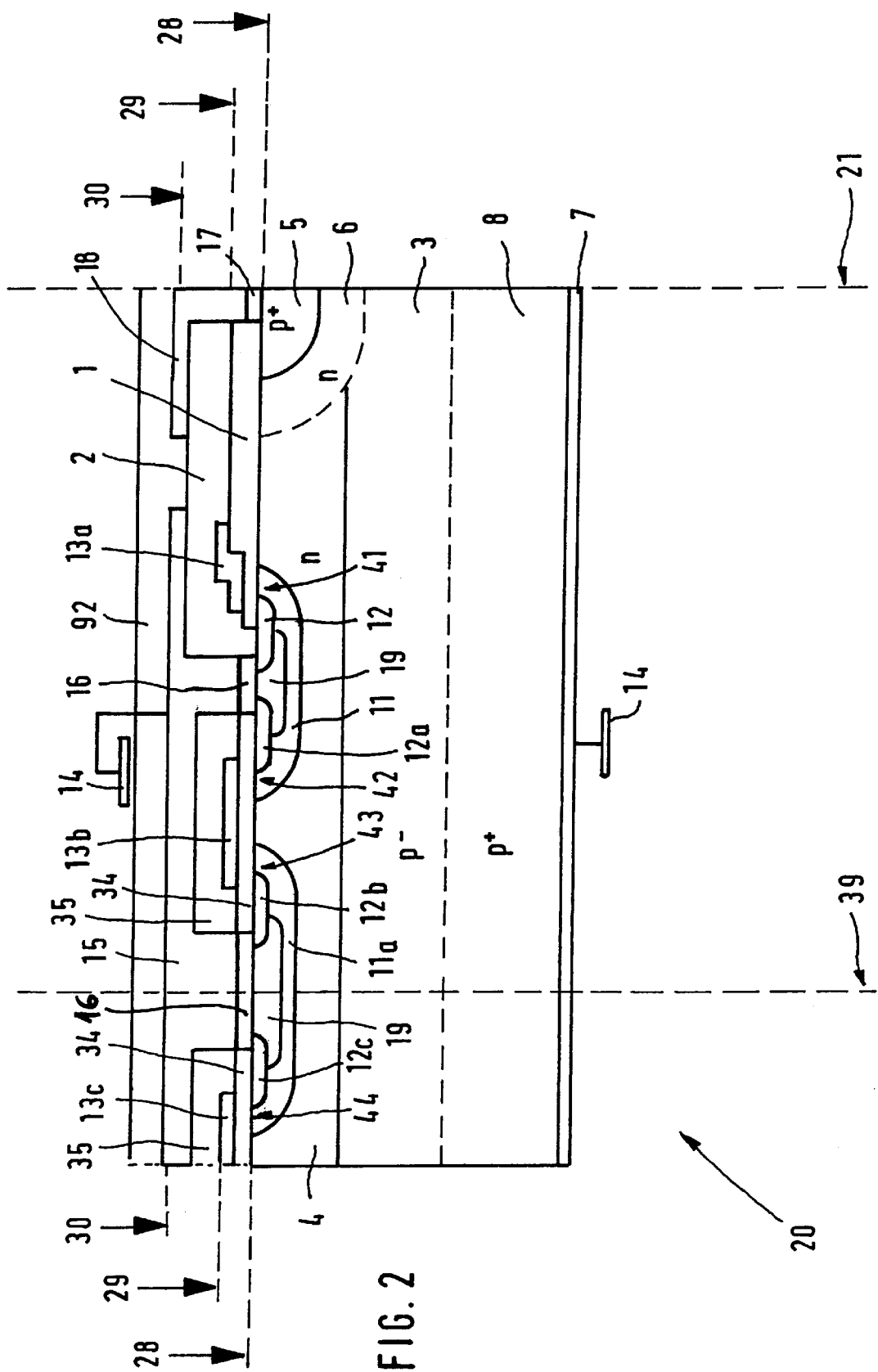
FIG. 2 shows a cross section of a second exemplary embodiment of a transistor component according to the present invention.

FIG. 2 shows a multichannel arrangement of a LIGBT according to this invention. A component has a first gate terminal 13a, a second gate terminal 13b and a third gate terminal 13c. These gate terminals are insulated from the semiconductor substrate by insulation layers 1 and 34. These gate electrodes are assigned to regions 41, 42, 43 and 44 of the interconnected p wells 11 and 11a, and these regions can be switched as inversion channels via the gate electrodes. Thus the basic structure is the same as that in FIG. 1 except for the fact that three inversion channels can be switched per half of anode region 5. Thus, the cross section shown here along the first line of symmetry 21 and the third line of symmetry 39 should be imagined as continued in mirror image, resulting in a parallel connection of many transistors by analogy with FIG. 1, but with more than one region that can be switched as an inversion channel per half of anode region 5. In the embodiment shown here, additional n wells 12a, b and c are provided for this purpose in the two connected P troughs 11 and 11a. The reference numbers used so far designate the same parts as in FIG. 1 and will not be described again. Insulation layers 35 insulate the gate terminals 13b and 13c from the cathode field plate 15 above it. Furthermore, FIG. 2 shows a first top view plane 28, a second top view plane 29 and a third top view plane 30. The top view planes designate the planes illustrated below in FIGS. 6 through 8.

The parallel connection of several channel areas per anode region reduces the effective total channel resistance. This makes possible a high-current density at a defined voltage drop between the anode and cathode. The robustness against latch-up is increased in comparison with a LIGBT with only one channel due to the fact that the hole current is divided among several channel regions. In comparison with a trench LIGBT on SOI (silicon on insulator) with multiple parallel channel regions, the component according to the present invention can be produced more easily and less expensively because the processing costs and wafer costs are lower since standard processes and standard wafers can be used. This multichannel principle can also be used with LIGBT components with vertical current flow whose rear contacting is not over a diffusion region but is instead over a highly doped substrate, for example, on whose front side are arranged epitaxially applied layers.

Figure 3:
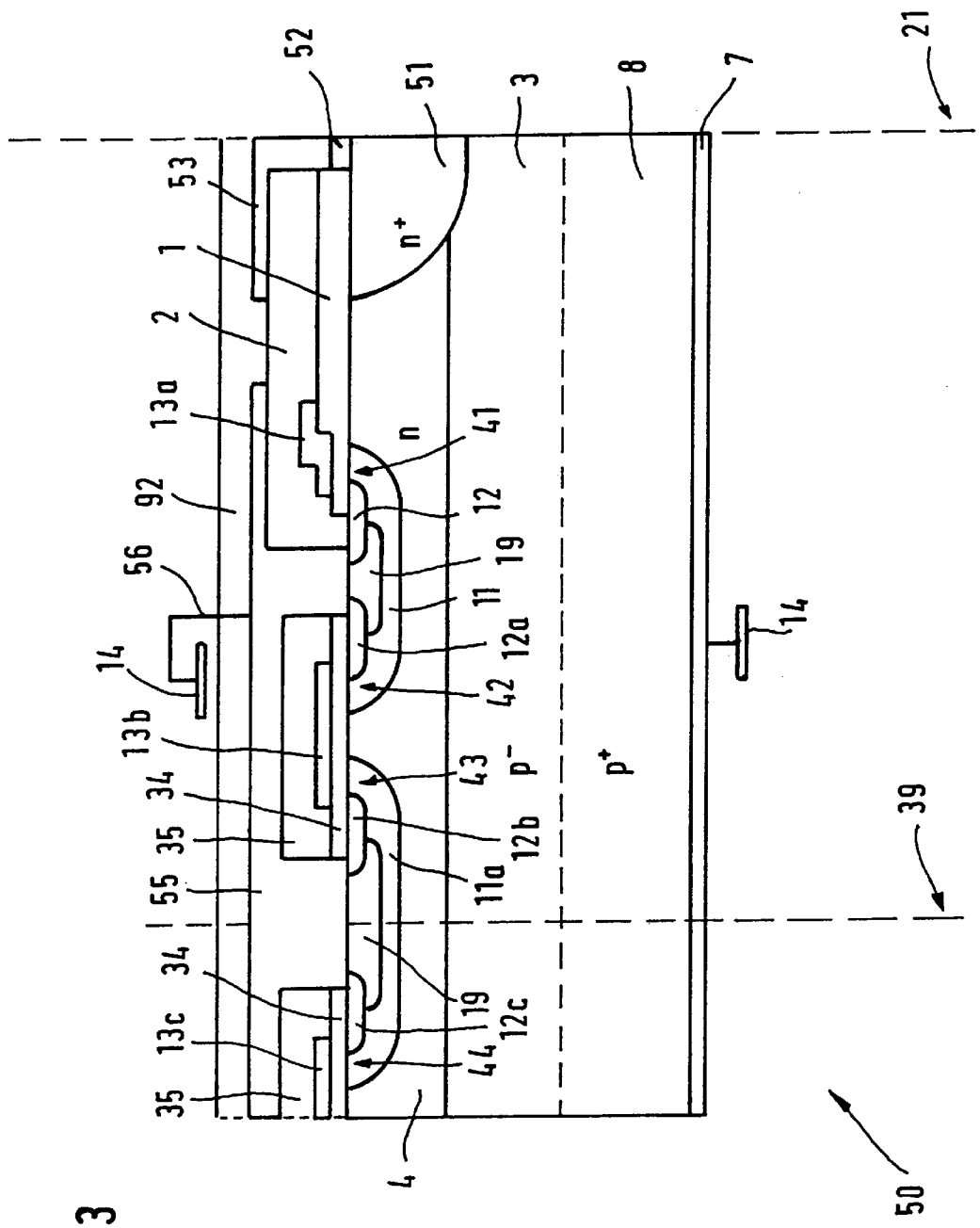
FIG. 3 shows a cross section of a third exemplary embodiment of a transistor component according to the present invention.

FIG. 3 shows a detail 50 of a third exemplary embodiment. In comparison with FIG. 2, the anode region 5 and buffer layer 6 are replaced here by a single, heavily n-doped drain region 51. In contrast with FIG. 2, the embodiment according to FIG. 3 is a MOS component which has a drain terminal 52, a drain field plate 53 and a source magnetoresistor 55 which is connected to the source terminal 56.

This embodiment illustrates the applicability of the multichannel principle to MOS components to achieve a small total effective channel resistance due to parallel connected channel regions. With the design according to the present invention, a high-current carrying capability and good "on" state performance of the device together with a high blocking ability can also be achieved with MOS components.

Figure 4:
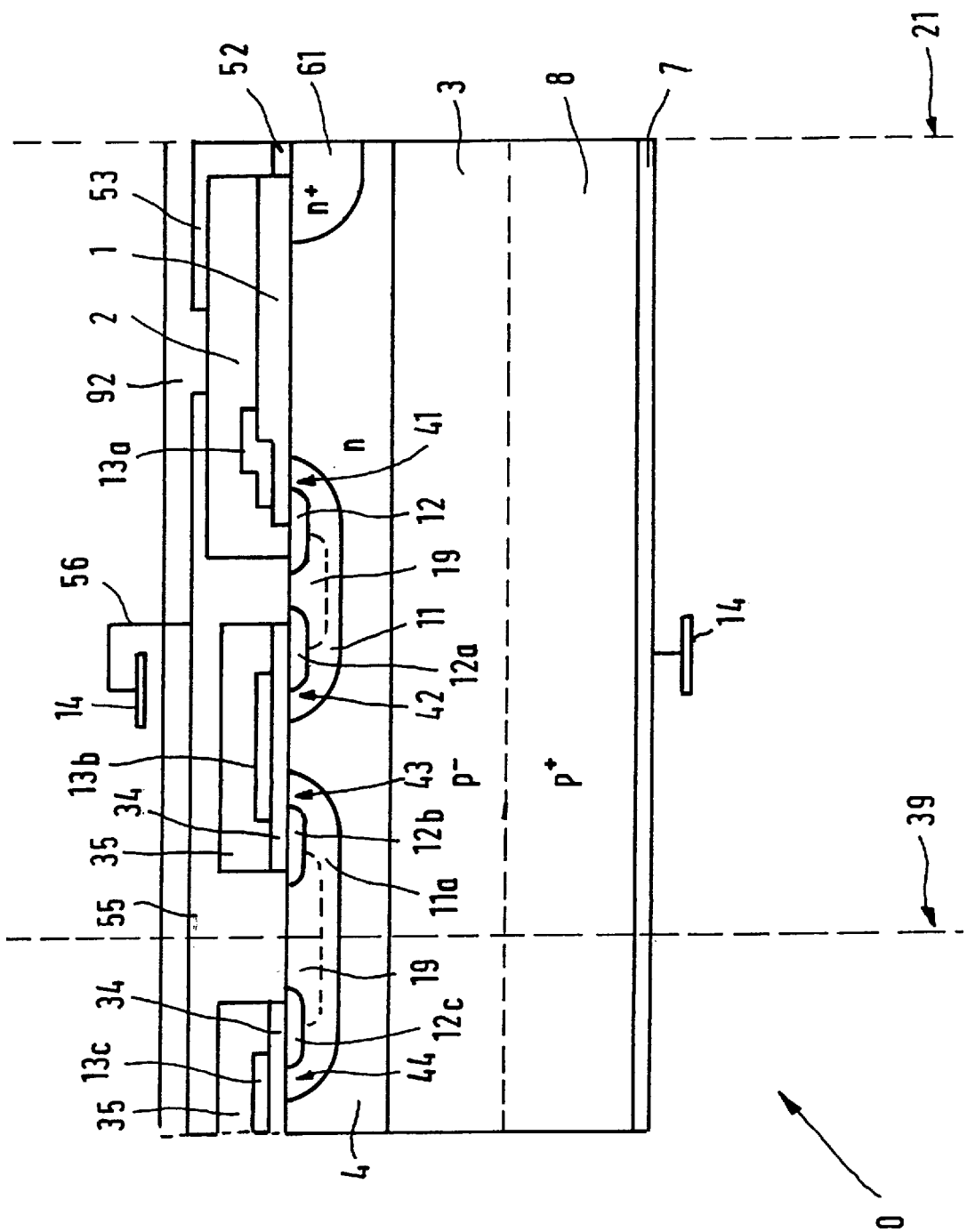
FIG. 4 shows a cross section of a fourth exemplary embodiment of a transistor component according to the present invention.

FIG. 4 shows an exemplary MOS component like that in FIG. 3, with the only difference being that the drain region is designed as a shallow drain region 61, i.e., it is not connected directly to the P substrate 3, but instead is separated from it by the n region 4. Depending on the use of the device, a deep drain region 51 (FIG. 3) or a shallow drain region 61 (FIG. 4) can be provided. The deep drain region 61 should be selected when optimum "on" state performance are desired, i.e., the lowest possible forward voltage at a given current. Due to the deep drain region, the large increase in current density occurring at its peak in the case of the shallow drain region is prevented and a homogeneous current flow in the resurf region is achieved. On the other hand, the long diffusion time required for deep drain diffusion is unnecessary when using the shallow drain region.

Figure 5:
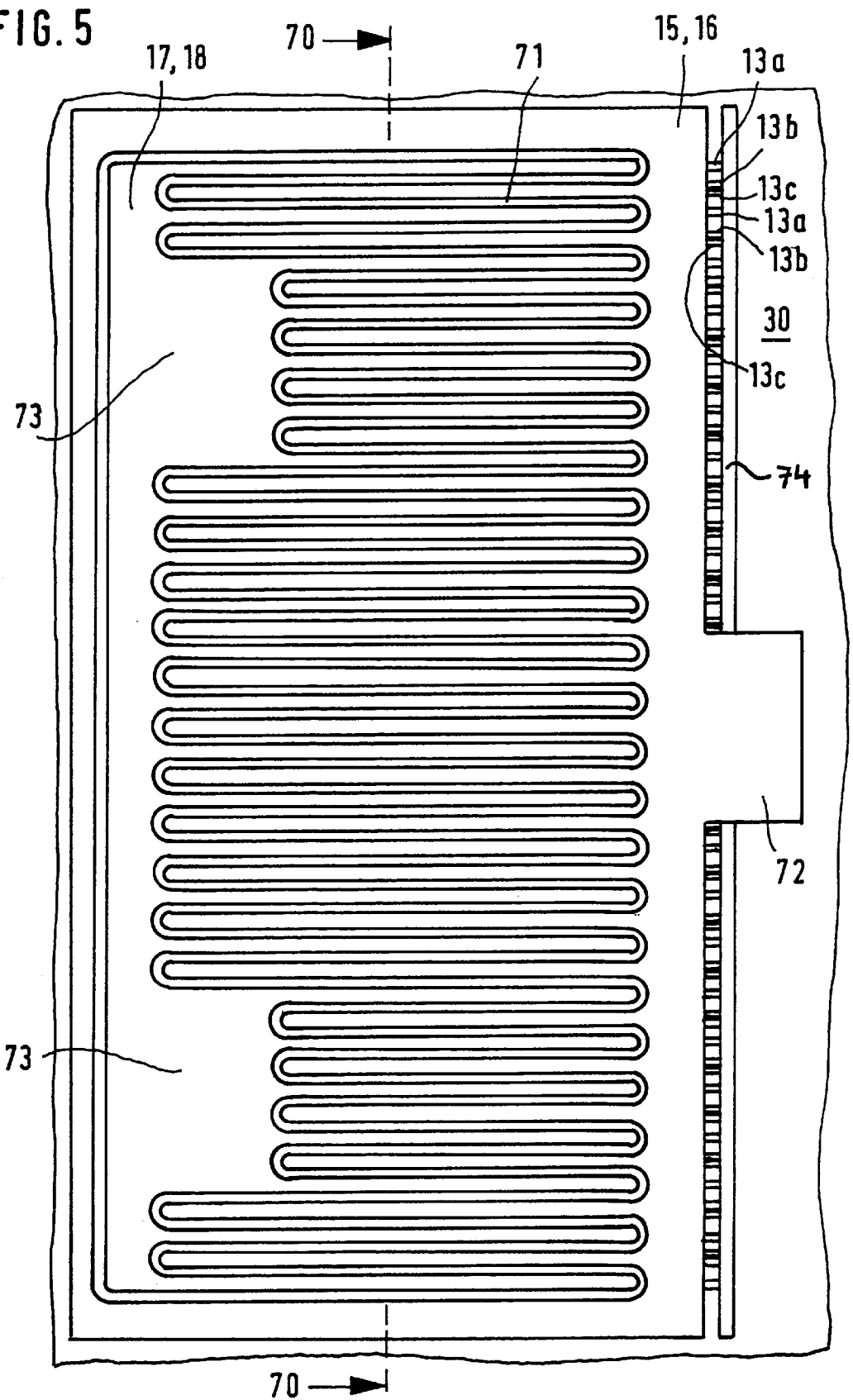
FIG. 5 shows a top view of an exemplary transistor component according to the present invention, in accordance with FIG. 2.
Figure 6:
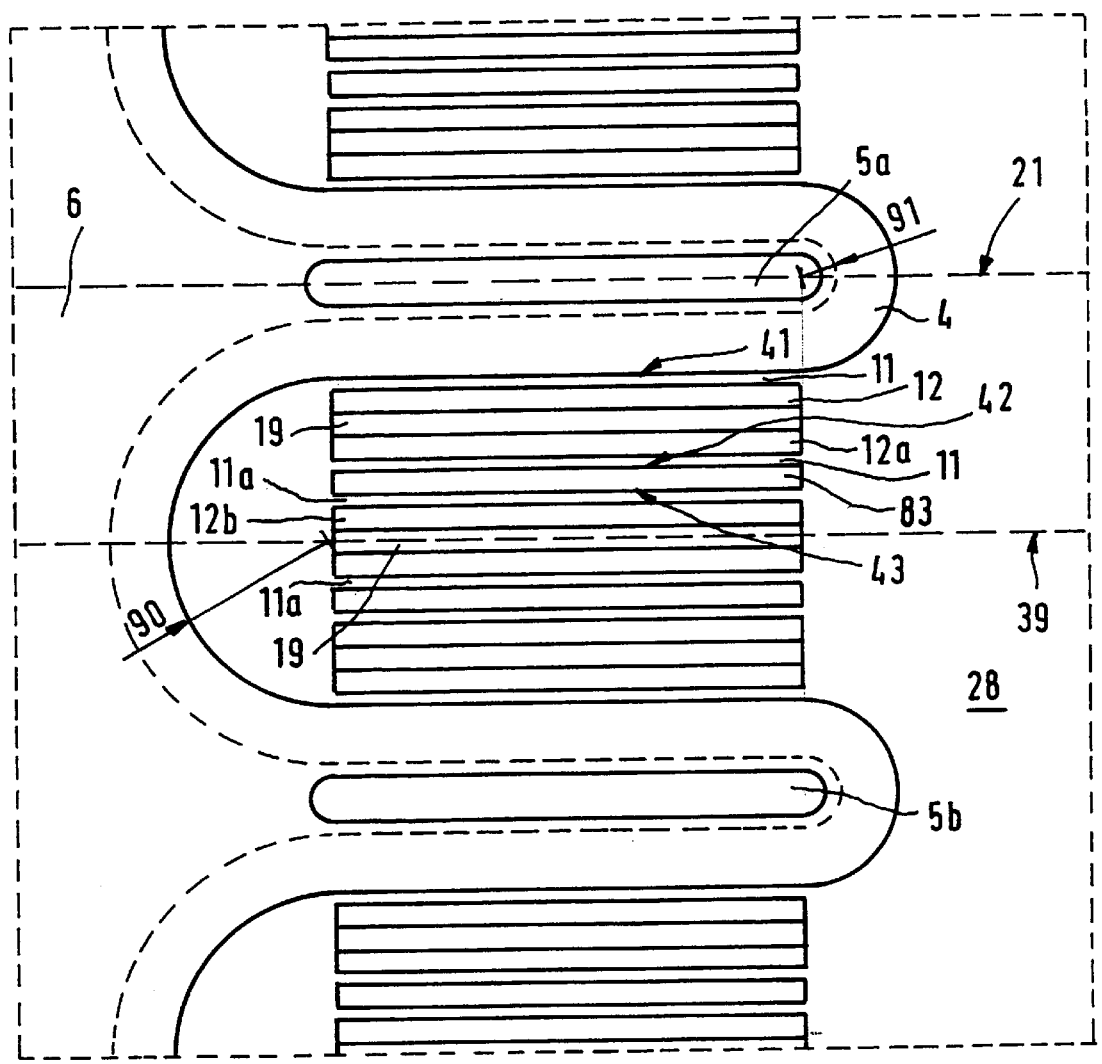
FIG. 6 shows a first detail view of the top view of the exemplary transistor component of FIG. 2.

FIG. 5 shows a top view of the third top view plane 30, as marked in FIG. 2, of an exemplary transistor component according to the present invention. Line 70 denotes the cross-sectional plane which is shown in the cross-sectional drawings in FIGS. 1 through 4. This shows the anode and cathode terminals 17 and 16, which are arranged like the teeth of two combs, and their respective field plates 18 and 15. The anode bond pads of the device are labeled as 73 and the cathode bond pad is 72. The insulation layer which electrically insulates the field plates from the underlying gate terminals can be seen in the intermediate region 71 between the intermeshing prongs of the cathode and anode field plates. The gate bus terminal 74 provides the interconnection among the gate terminals of the individual transistor cells, with three gate terminals 13a, b, c shown per tooth of the "cathode comb" (15, 16). In this detail of the drawing, the multichannel principle described in FIG. 2 can be seen in this view. Details of this layout are shown in FIGS. 6 through 8. FIG. 6 shows a top view of the transistor component according to this invention in bipolar technology with a multichannel arrangement in the first top view plane 28, as marked in FIG. 2. The unit cell of the periodically continued layout is the region between the first line of symmetry 21 and the third line of symmetry 39. In the example shown here, three channel regions 41, 42 and 43 are assigned per half of anode region 5a. The channel regions are regions of the connected p wells 11 and 11a that can be triggered by gate terminals above them that are insulated from the semiconductor by an insulation layer. Embedded in the p wells are n wells 12 and 12a as well as 12b, which have been introduced into the p wells just as the heavily p-doped dopant zones 19 have been introduced into the p wells. In the embodiment shown here with three channel regions per half of an anode finger, the component has an island 83 of n region 4 in the p well region per unit cell of the layout. Otherwise the n region 4 in the first top view plane 28 runs in a meandering pattern around the anode regions 5a, 5b as well as around the p well regions. Buffer layer 6 is between the anode regions 5a, 5b and n region 4. This multichannel arrangement can be transferred to a MOS transistor component, as already indicated in FIGS. 3 and 4, by replacing anode regions 5a, 5b and buffer layer 6 with a heavily n-doped drain region 51 or optionally by a shallow drain region 61.

To achieve a high blocking voltage in the case of the LIGBT as well as the lateral MOS transistor component, the radii of curvature 90, 91 at the ends of the anode and cathode fingers should be large enough so that the breakdown voltage of the component is not significantly reduced by field peaks at the ends of the fingers due to the geometry. For this reason, to accommodate multiple parallel-connected channel regions, the cathode finger in a high-blocking LIGBT or MOS transistor must in general not be designed wider than necessary to achieve a high breakdown voltage anyway.

FIG. 7 shows a top view of the second top view plane 29, as marked in FIG. 2, corresponding to FIG. 6, although only two unit cells of the layout are shown in FIG. 7. Anode terminal 17 on anode region 5 can be seen in this second top view plane 29. The two-part cathode terminal 16 per unit cell contacts the heavily p-doped dopant zones 19 and parts of n wells 12, 12a and 12b. The gate terminal 13 is designed in two parts per half of cathode finger, with gate terminal 13 a running in a meandering pattern and the second gate terminal part 13b designed in strips. Gate terminal part 13a and gate terminal part 13b lead to the outside on the side facing away from buffer layer 6 so that they can be connected to gate bus terminal 74 as shown in FIG. 5. The same thing also applies to the third gate terminal 13c in the second half of each cathode finger.

Finally, FIG. 8 shows a top view corresponding to FIGS. 6 and 7 of a semiconductor component according to this invention in the third top view plane 30, as marked in FIG. 2. FIG. 8 is thus an enlarged detail from FIG. 5 with the respective lines of symmetry 21 and 39 and it illustrates the coverage of the component with magnetoresistors 15 and 18 between which the underlying insulation layer can be seen only in intermediate region 71.

What is claimed is:

1. A transistor component, comprising:
   at least one insulated-gate electrode;
   a doped substrate having a lateral current flow and a vertical current flow, wherein the doped substrate is of a first dopant type;
   a doped region arranged on a front side of the doped substrate, wherein the doped region is of a second dopant type opposite to the first dopant type;
   a heavily doped anode region provided within the doped region, wherein the heavily doped anode region is of the first dopant type; and
   a rear contact electrically connected to the doped substrate across a heavily doped diffusion region, wherein the heavily doped diffusion region is of the first dopant type, and wherein the vertical current flow is over the rear contact.

2. The transistor component according to claim 1, wherein the doped region is a resurf region.

3. The transistor component according to claim 1, further comprising a doped buffer layer separating the heavily doped anode region from adjacent areas of the doped region, wherein the doped buffer layer is of the second dopant type.

4. The transistor component according to claim 3, wherein the buffer layer has a greater depth of penetration than the doped region.

5. The transistor component according to claim 1, further comprising:
   at least one first doped striated well provided within the doped region, wherein the at least one first doped striated well is of the first dopant type, wherein the heavily doped anode region is striated having at least two strips, and wherein the at least one first doped striated well is arranged between the at least two strips of the heavily doped anode region;
   at least one second doped striated well provided within the at least one first doped striated well is of the second dopant type; and
   at least one inversion channel can be created with aid of the at least one insulated-gate electrode.

6. The transistor component according to claim 5, wherein the at least one first doped striated well includes two connected wells arranged between the at least two strips of the heavily doped anode region, wherein adjacent regions of the two connected wells include the at least one inversion channel, and wherein each one of the at least one inversion channel located in the adjacent regions of the two connected troughs is driven via one of the at least one insulated-gate electrode common to the two connected wells.

7. The transistor component according to claim 5, further comprising a cathode terminal electrically connected to the at least one first doped striated well across a heavily doped dopant zone, wherein the heavily doped dopant zone is of the first dopant type.

8. The transistor component according to claim 1, wherein the first dopant type is a p type dopant and the second dopant type is an n type dopant.

9. The transistor component according to claim 8, wherein:
the rear contact is connected across a P−/P+ junction formed by diffusion in the doped substrate.

10. The transistor component according to claim 1, wherein the first dopant type is an n type dopant and the second dopant type is a p type dopant.

11. The transistor component according to claim 1, further comprising:
a heavily doped striated drain region having at least two strips provided within the doped region, wherein the heavily doped striated drain region is of the second dopant type;
at least two first doped striated wells provided within the doped region and arranged between the at least two strips of the heavily doped striated drain region, wherein the at least two first doped striated wells are of the first dopant type, wherein in at least one operating state the heavily doped striated drain region receives a higher potential relative to the at least two first doped striated wells, and wherein regions of adjacent ones of the at least two first doped striated wells including at least one inversion channel are driven via the at least one insulated-gate electrode common to the regions of the adjacent first doped striated wells; and
at least one second doped striated well provided within each of the at least two first doped striated wells, wherein the at least one second doped striated well is of the second dopant type.

12. The transistor component according to claim 11, further comprising a source terminal electrically connected to the at least two first doped striated troughs across a heavily doped dopant zone, wherein the heavily doped dopant zone is of the first dopant type.

13. The transistor component according to claim 11, wherein the first dopant type is a p type dopant and the second dopant type is an n type dopant.

14. The transistor component according to claim 11, wherein the first dopant type is an n type dopant and the second dopant type is a p type dopant.

15. The transistor component according to claim 1, wherein:
the heavily doped anode region includes a heavily doped striated anode region having at least two strips provided within the doped region,
the heavily doped striated anode region is of the first dopant type, the transistor component further comprising:
at least one first doped striated well provided within the doped region and arranged between the at least two strips of the heavily doped striated anode region, wherein the at least one first doped striated well is of the first dopant type, wherein in at least one operating state the heavily doped striated anode region receives a higher potential relative to the at least one first doped striated well;
at least one second doped striated well provided within each of the at least one first doped striated well, wherein the at least one second doped striated well is of the second dopant type; and
at least two inversion channels provided with aid of the at least one insulated-gate electrode.

16. The transistor component according to claim 15, wherein the at least one first doped striated well includes two connected wells arranged between the at least two strips of the heavily doped striated anode region, wherein adjacent regions of the two connected wells include one of the at least two inversion channels, and wherein each one of the at least two inversion channels is driven via one of the at least one insulated-gate electrode.

17. The transistor component according to claim 15, wherein the first dopant type is a p type dopant and the second dopant type is an n type dopant.

18. The transistor component according to claim 15, wherein the first dopant type is an n type dopant and the second dopant type is a p type dopant.

* * * * *

UNITED STATES PATENT AND TRADEMARK OFFICE
CERTIFICATE OF CORRECTION

PATENT NO.    : 6,236,068 B1
DATED         : May 22, 2001
INVENTOR(S)   : Feiler, Wolfgang It is certified that error appears in the above-identified patent and that said Letters Patent is hereby corrected as shown below:

Column 2,
Line 45, after "on" insert -- state --

Column 5,
Line 34, change "PN" to -- pn --

Column 6,
Lines 55 and 56, change "magnetoresistor" to -- field plate --

Signed and Sealed this

Third Day of September, 2002

Attest:

JAMES E. ROGAN
Attesting Officer        Director of the United States Patent and Trademark Office